(12) United States Patent
Haberecht et al.

(10) Patent No.: US 8,268,708 B2
(45) Date of Patent: Sep. 18, 2012

(54) EPITAXIALLY COATED SILICON WAFER AND METHOD FOR PRODUCING EPITAXIALLY COATED SILICON WAFERS

(75) Inventors: Joerg Haberecht, Freiberg (DE); Christian Hager, Kastl (DE); Georg Brenninger, Oberbergkirchen (DE)

(73) Assignee: Siltronic AG, Munich (DE)

( * ) Notice: Subject to any disclaimer, the term of this patent is extended or adjusted under 35 U.S.C. 154(b) by 240 days.

(21) Appl. No.: 12/652,056

(22) Filed: Jan. 5, 2010

(65) Prior Publication Data
US 2010/0176491 A1   Jul. 15, 2010

(30) Foreign Application Priority Data

Jan. 14, 2009   (DE) .......................... 10 2009 004 557

(51) Int. Cl.
*H01L 21/20* (2006.01)
*H01L 29/06* (2006.01)
(52) U.S. Cl. ................... 438/504; 257/618; 257/E21.02
(58) Field of Classification Search ........... 257/E21.114; 438/492, 905, 478, 503
See application file for complete search history.

(56) References Cited

U.S. PATENT DOCUMENTS

| | | | |
|---|---|---|---|
| 5,400,548 A | 3/1995 | Huber et al. | |
| 2002/0022351 A1 | 2/2002 | Schmolke et al. | |
| 2003/0186028 A1 | 10/2003 | Wenski et al. | |
| 2004/0053515 A1 | 3/2004 | Comita et al. | |
| 2004/0115941 A1 | 6/2004 | Siebert et al. | |
| 2007/0010033 A1 | 1/2007 | Aderhold et al. | |
| 2007/0062438 A1* | 3/2007 | Schauer et al. | 117/89 |
| 2007/0066082 A1 | 3/2007 | Schauer et al. | |
| 2008/0182397 A1 | 7/2008 | Lam et al. | |
| 2008/0245767 A1 | 10/2008 | Kim et al. | |
| 2009/0261456 A1 | 10/2009 | Schauer et al. | |

FOREIGN PATENT DOCUMENTS

| | | |
|---|---|---|
| DE | 19938340 C1 | 2/2001 |
| DE | 19960823 A1 | 7/2001 |
| DE | 10025871 A1 | 12/2001 |
| DE | 102005045337 A1 | 4/2007 |
| DE | 102005045338 A1 | 4/2007 |
| DE | 102005045339 A1 | 4/2007 |
| EP | 0272531 A1 | 6/1988 |
| EP | 0547894 A1 | 6/1993 |
| EP | 0580162 A1 | 1/1994 |

* cited by examiner

*Primary Examiner* — Victor A Mandala
*Assistant Examiner* — Selim Ahmed
(74) *Attorney, Agent, or Firm* — Brooks Kushman P.C.

(57) ABSTRACT

Silicon wafers polished on their front sides are individually placed on a susceptor in an epitaxy reactor and firstly pretreated under a hydrogen atmosphere, and secondly with addition of an etching medium with a flow rate of 1.5-5 slm to the hydrogen atmosphere, the hydrogen flow rate being 1-100 slm in both steps, and subsequently epitaxially coated on the polished front side, and then removed from the reactor. In a second method, gas flows introduced into the reactor by injectors are distributed into outer and inner zones of the chamber, such that the inner zone gas flow acts on a wafer central region and the outer zone gas flow acts on a wafer edge region, the inner/outer distribution of the etching medium I/O=0-0.75. Silicon wafers having an epitaxial layer having global flatness value GBIR of 0.02-0.06 μm, relative to an edge exclusion of 2 mm are produced.

19 Claims, 6 Drawing Sheets

EPITAXIALLY COATED SILICON WAFER AND METHOD FOR PRODUCING EPITAXIALLY COATED SILICON WAFERS

CROSS-REFERENCE TO RELATED APPLICATIONS

This application claims priority to German application DE 10 2009 004 557.0 filed Jan. 14, 2009, which is herein incorporated by reference.

BACKGROUND OF THE INVENTION

1. Field of the Invention

The invention relates to an epitaxially coated silicon wafer and to a method for producing epitaxially coated silicon wafers.

2. Background Art

Epitaxially coated silicon wafers are suitable for use in the semiconductor industry, in particular for the fabrication of large scale integrated electronic components such as e.g. microprocessors or memory chips. Starting materials (substrates) for modern microelectronics are required to meet stringent requirements with respect to global and local flatness, thickness distribution, single-side-referenced local flatness (nanotopology) and freedom from defects.

Global flatness relates to the entire surface of a semiconductor wafer minus an edge exclusion to be defined. It is described by the GBIR ("global backsurface-referenced ideal plane/range"=magnitude of the positive and negative deviation from a backside-referenced ideal plane for the entire front side of the semiconductor wafer), which corresponds to the TTV ("total thickness variation") specification that was formerly customary.

The LTV ("local thickness variation") specification that was formerly customary is nowadays designated according to the SEMI standard by SBIR ("site backsurface-referenced ideal plane/range"=magnitude of the positive and negative deviation from a backside-referenced ideal plane for an individual component area defined dimension) and corresponds to the GBIR or TTV of a component area ("site"). Therefore, in contrast to the global flatness GBIR, the SBIR is referenced to defined fields on the wafer, that is to say for example to segments of an area grid of measurement windows having a size of 26×8 mm² (site geometry). The maximum site geometry value $SBIR_{max}$ specifies the maximum SBIR value for the component areas taken into account on a silicon wafer.

Maximum site-referenced flatness or geometry values such as the $SBIR_{max}$ are usually determined taking account of a certain edge exclusion (EE="edge exclusion") of 3 mm, by way of example. An area on a silicon wafer within a nominal edge exclusion is usually referred to as the "Fixed Quality Area", abbreviated as FQA. Those sites which have part of their area lying outside the FQA, but the center of which lies within the FQA, are called "partial sites". The determination of the maximum local flatness often does not involve using the "partial sites", but rather only the so-called "full sites", that is to say the component areas lying completely within the FQA. In order to be able to compare maximum flatness values, it is essential to specify the edge exclusion and thus the size of the FQA and furthermore to specify whether or not the "partial sites" have been taken into account.

Furthermore, with regard to optimizing costs, it is frequently customary nowadays not to reject a silicon wafer owing, for example, only to a component area that exceeds the $SBIR_{max}$ value specified by the component manufacturer, but rather to permit a defined percentage, e.g. 1%, of component areas to have higher values. The percentage of the sites which lie or are permitted to lie below a specific limit value of a geometry parameter is usually specified by a PUA ("Percent Useable Area") value, which, e.g. in the case of an $SBIR_{max}$ of less than or equal to 0.7 µm and a PUA value of 99%, indicates that 99% of the sites have an $SBIR_{max}$ of less than or equal to 0.7 µm while higher SBIR values are also permitted for 1% of the sites ("chip yield").

According to the prior art, a silicon wafer can be produced by a process sequence of separating a single crystal of silicon into wafers, rounding the mechanically sensitive edges, carrying out an abrasive step such as grinding or lapping followed by polishing. EP 547894 A1 describes a lapping method; grinding methods are described in applications EP 272531 A1 and EP 580162 A1.

The final flatness is generally produced by the polishing step, which may be preceded, if appropriate, by an etching step for removing disturbed crystal layers and for removing impurities. A suitable etching method is known from DE 19833257 C1, by way of example. Traditional single-side polishing methods generally lead to poorer plane-parallelisms, while polishing methods acting on both sides ("double side polishing") make it possible to produce silicon wafers with improved flatness.

In the case of polished silicon wafers, therefore, an attempt is made to achieve the required flatness by suitable processing steps such as grinding, lapping and polishing.

However, the polishing of a silicon wafer usually gives rise to a decrease in the thickness of the planar silicon wafer toward the edge ("edge roll-off"). Etching methods also tend to attack the silicon wafer to a greater extent at the edge and also to produce such an edge roll-off. In order to counteract this, it is customary for silicon wafers to be polished concavely. A concavely polished silicon wafer is thinner in the center, then increases in its thickness toward the edge, and has a decrease in thickness in an outer edge region.

DE 19938340 C1 describes depositing a monocrystalline layer on monocrystalline silicon wafers, the deposited layer being made of silicon with the same crystal orientation, a so-called epitaxial layer, on which semiconductor components are applied later. Systems of this type have certain advantages over silicon wafers made of homogeneous material, for example the prevention of charge reversal in bipolar CMOS circuits followed by the short circuiting of the component ("latch-up"), lower defect densities (for example reduced number of COPs ("crystal-originated particles") and also the absence of an appreciable oxygen content, whereby it is possible to preclude short-circuit risk due to oxygen precipitates in component-relevant regions.

According to the prior art, epitaxially coated silicon wafers are produced from suitable intermediates by means of a process sequence of removal polishing-final polishing-cleaning-epitaxy.

DE 10025871 A1, for example, discloses a method for producing a silicon wafer with an epitaxial layer deposited on its front side, the method comprising the following process steps:

(a) a removal polishing step as the sole polishing step;
(b) (hydrophilic) cleaning and drying of the silicon wafer;
(c) pretreatment of the front side of the silicon wafer at a temperature of 950 to 1250 degrees Celsius in an epitaxy reactor; and
(d) deposition of an epitaxial layer on the front side of the pretreated silicon wafer.

It is customary, in order to protect silicon wafers from particle loading, to subject the silicon wafers to a hydrophilic cleaning after polishing. The hydrophilic cleaning produces native oxide on the front and rear sides of the silicon wafer which is very thin (approximately 0.5-2 nm, depending on the type of cleaning and measurement). This native oxide is removed in the course of a pretreatment in an epitaxy reactor under a hydrogen atmosphere (also called "$H_2$ bake").

In a second step, the surface roughness of the front side of the silicon wafer is reduced and polishing defects are removed from the surface by usually small amounts of an etching medium, for example gaseous hydrogen chloride (HCl) being added to a hydrogen atmosphere.

Sometimes, besides an etching medium such as HCl, a silane compound, for example silane ($SiH_4$), dichlorosilane ($SiH_2Cl_2$), trichlorosilane (TCS, $SiHCl_3$) or tetrachlorosilane ($SiCl_4$), is also added to the hydrogen atmosphere in an amount such that silicon deposition and silicon etching removal are in equilibrium. Both reactions proceed at a sufficiently high reaction rate, however, so that silicon on the surface is mobile and the surface is smoothed and defects are removed on the surface.

Epitaxy reactors, which are used in particular in the semiconductor industry for the deposition of an epitaxial layer on a silicon wafer, are described in the prior art. During all coating or deposition steps, one or more silicon wafers are heated by means of heating sources, preferably by means of upper and lower heating sources, for example lamps or lamp banks, and subsequently exposed to a gas mixture comprising a source gas, a carrier gas and, if appropriate, a doping gas.

A susceptor, which comprises graphite, SiC or quartz, for example, serves as a support for the silicon wafer in a process chamber of the epitaxy reactor. During the deposition process, the silicon wafer rests on this susceptor or in milled-out portions of the susceptor in order to ensure a uniform heating and to protect the rear side of the silicon wafer, on which usually there is no deposition, from the source gas. In accordance with the prior art, the process chambers are designed for one or more silicon wafers.

In the case of silicon wafers having relatively large diameters (greater than or equal to 150 mm), single wafer reactors are usually used and the silicon wafers are processed individually since this results in a good epitaxial layer thickness regularity. The uniformity of the layer thickness can be established by various measures, for example by altering the gas flows ($H_2$, $SiHCl_3$), by incorporating and adjusting gas inlet devices (injectors), by changing the deposition temperature, or by modifications to the susceptor.

In epitaxy it is furthermore customary, after one or more epitaxial depositions on silicon wafers, to carry out an etching treatment of the susceptor without a substrate, in the course of which the susceptor and also other parts of the process chamber are freed of silicon deposits. This etch, using hydrogen chloride (HCl), for example, is often carried out after the processing of only a small number of silicon wafers (after 1 to 5 silicon wafers) in the case of single wafer reactors, and is not carried out in part until after the processing of more silicon wafers (after 10 to 20 silicon wafers) in the case of depositing thin epitaxial layers. Usually, only an HCl etching treatment or else an HCl etching treatment followed by brief coating of the susceptor is performed.

The production of epitaxially coated silicon wafers with good global flatness proves to be extremely difficult since, as mentioned above, a concavely polished silicon wafer is usually present as the substrate. In the prior art, after the epitaxy, the global flatness and also the local flatness of the epitaxially coated silicon wafer have usually deteriorated compared with those of the concavely polished silicon wafer. This is associated, inter alia, with the fact that the deposited epitaxial layer itself also has a certain irregularity.

Although the deposition of a thicker epitaxial layer in the center of the concavely polished silicon wafer, where the thickness of said layer would have to decrease outward in the direction of the edge of the silicon wafer, could compensate for the originally concave form of the silicon wafer and thus also improve the global flatness of the silicon wafer, this is not considered in the epitaxy of silicon wafers since an important specification of an epitaxially coated silicon wafer, namely a limit for the regularity of the epitaxial layer, cannot be exceeded.

DE 102005045339 A1 discloses a method for producing epitaxially coated silicon wafers in which a multiplicity of silicon wafers which are polished at least on their front sides are successively coated individually in an epitaxy reactor by a procedure in which a silicon wafers is placed on a susceptor in the epitaxy reactor, and pretreated under a hydrogen atmosphere at a first hydrogen flow rate of 20-100 slm in a first step, and with addition of an etching medium to the hydrogen atmosphere at a second, reduced hydrogen flow rate of 0.5-10 slm in a second step, the wafer is subsequently coated epitaxially on its polished front side and removed from the epitaxy reactor, and an etching treatment of the susceptor is furthermore effected after a specific number of epitaxial coatings.

DE 102005045339 A1 also discloses a silicon wafer having a front side and a rear side, wherein at least its front side is polished and an epitaxial layer is applied at least on its front side, and which has a global flatness value GBIR of 0.07-0.3 µm, relative to an edge exclusion of 2 mm. The comparatively good geometry of this epitaxially coated silicon wafer results from the fact that the reduction of the hydrogen flow rate in the second step of the pretreatment with addition of an etching medium makes it possible to etch away material at the edge of the silicon wafer in a targeted manner and to globally level the silicon wafer before the epitaxial-coating step. Disadvantages of the method disclosed in DE 102005045339 are that although the reduced hydrogen flow rate intensifies the etching effect at the edge of the polished wafer, the gas flow over the semiconductor wafer is not laminar. It has been shown that precisely this flow impedes further optimization of the global flatness below the GBIR value of 0.07 µm disclosed in DE 102005045339 A1.

US 2008/0182397 A1 discloses an epitaxy reactor which provides different gas flows in a so-called "inner zone" and a so-called "outer zone". For a wafer having a diameter of 300 mm, the "inner zone" is specified as a central region of the 300 mm wafer having a diameter of 75 mm. The setting of the different gas flows in the reactor is effected by setting the diameter of the gas pipes; thus, e.g. reducing the pipe diameter also reduces the gas flow in the direction of one of the two zones. Such gas distribution systems are commercially available from Applied Materials Inc. under the name Epi Centura Accusett™ (Epi Centura is the name of the epitaxy reactor from Applied Materials Inc.). As an alternative, for controlling the gas flows it is also possible to use so-called "Mass Flow Controllers" or similar devices for regulating the flow. The gas distribution in inner and outer zones is designated by I/O in US 2008/0182397 A1. This notation will also be used in the context of the present invention. US 2008/0182397 A1 specifies two ranges for gas distribution I/O: firstly a range of I/O=0.2-1.0 during the epitaxial coating and secondly an I/O of 1.0-6.0 during the etching step (substrate pretreatment).

US 2008/0245767 A1 discloses a method in which a contaminated or damaged layer of a substrate is removed by means of an etching gas in order to uncover a substrate surface. This cleaned substrate can subsequently be epitaxially coated. The flow rate of the etching gas is 0.01-15 slm. If an inert gas (inert with respect to the substrate material, e.g. silicon) such as hydrogen or else nitrogen, argon, helium or the like is supplied, the flow rate thereof is 1-100 slm. The temperature of the substrate is 600-850° C. values of 1.0-7.0 (5/5-35/5) is specified as I/O ratio of the hydrogen flow.

US 2007/0010033 A1 discloses influencing the thickness of an epitaxially deposited layer by regulating the gas distribution in an inner and an outer zone. As mentioned above, however, the deposition of a thicker epitaxial layer in the center of the concavely polished silicon wafer, in order to compensate for the initial geometry of the polished wafer, is unsuitable since the specification of the layer thickness uniformity of the epitaxial layer would thereby be exceeded.

SUMMARY OF THE INVENTION

An object of the invention was to provide a method for epitaxially coating silicon wafers which makes it possible to provide epitaxially coated silicon wafers having improved global flatness in comparison with the prior art. These and other objects are achieved by means of a first method for producing epitaxially coated silicon wafers in which a multiplicity of silicon wafers which are polished at least on their front sides are successively coated individually in an epitaxy reactor by a procedure in which one of the silicon wafers is placed on a susceptor in the epitaxy reactor, and is pretreated only under a hydrogen atmosphere in a first step and with addition of an etching medium with a flow rate of 1.5-5 slm to the hydrogen atmosphere in a second step, the hydrogen flow rate being 1-100 slm in both steps, is subsequently coated epitaxially on its polished front side, and is removed from the epitaxy reactor.

The objects are also achieved by means of a second method for producing epitaxially coated silicon wafers in which a multiplicity of silicon wafers which are polished at least on their front sides are successively coated individually in an epitaxy reactor by a procedure in which one of the silicon wafers is placed on a susceptor in a reactor chamber of the epitaxy reactor in which gas flows introduced into the reactor chamber by means of injectors can be distributed by means of valves into an outer and an inner zone of the reactor chamber, such that the gas flow in the inner zone acts on a region around the center of the silicon wafer and the gas flow in the outer zone acts on an edge region of the silicon wafer, wherein the silicon wafer is pretreated only under a hydrogen atmosphere at a hydrogen flow rate of 1-100 slm in a first step and with addition of an etching medium with a flow rate of 1.5-5 slm to the hydrogen atmosphere in a second step, the hydrogen flow rate also being 1-100 slm in the second step, the distribution of the etching medium in inner and outer zones being I/O=0-0.75, is subsequently coated epitaxially on its polished front side, and is removed from the epitaxy reactor.

DETAILED DESCRIPTION OF THE PREFERRED EMBODIMENT(S)

In the method according to the invention, firstly a multiplicity of silicon wafers which are polished at least on their front sides are provided.

For this purpose, a silicon single crystal produced according to the prior art, preferably by crucible pulling according to Czochralski, is sawn into a multiplicity of silicon wafers by means of known separation methods, preferably by wire sawing with free ("slurry") or bonded grain (diamond wire) abrasive.

Furthermore, mechanical processing steps are effected, such as sequential single-side grinding methods (SSG), simultaneous double-side grinding methods ("double-disk grinding", DDG) or lapping. The edge of the silicon wafer including optionally present mechanical markings such as an orientation notch or an essentially rectilinear flattening of the silicon wafer edge ("flat") is generally processed as well (edge rounding, "edge-notch grinding"). Chemical treatment steps comprising cleaning and etching steps are additionally provided.

After the grinding, cleaning and etching steps, the surface of the silicon wafers is smoothed by removal polishing. In the case of single-side polishing (SSP), silicon wafers are held during processing on the rear side on a carrier plate by means of cement, by vacuum or by means of adhesion. In the case of double-side polishing (DSP), silicon wafers are inserted loosely into a thin toothed disk and polished on the front and rear side simultaneously in a manner "floating freely" between an upper and a lower polishing plate covered with a polishing cloth.

The front sides of the silicon wafers are then preferably polished in a haze-free manner, for example using a soft polishing cloth with the aid of an alkaline polishing sol. In order to obtain the flatness of the silicon wafers produced up to this step, the material removals are relatively small in this case, preferably 0.05 to 1.5 µm. This step is often referred to as CMP polishing (chemical-mechanical polishing) in the literature.

The silicon wafers provided are preferably polished concavely in order to restrict the edge roll-off caused by polishing steps (and also etching steps) to an outer edge region of the silicon wafer. The global flatness value GBIR of the polished silicon wafers provided is usually 0.2-0.5 µm given an edge exclusion of 2 mm.

After polishing, the silicon wafers are subjected to a hydrophilic cleaning and drying according to the prior art. The cleaning may be performed either as a batch method with simultaneous cleaning of a multiplicity of silicon wafers in baths, or by spraying methods or else as a single wafer process.

The silicon wafers provided are preferably wafers made of monocrystalline silicon material, SOI ("silicon-on-insulator") wafers, silicon wafers having strained silicon layers ("strained silicon") or sSOI ("strained silicon-on-insulator") wafers. Methods for producing SOI or sSOI wafers such as SmartCut™ and methods for producing wafers with strained silicon layers are known in the prior art.

The polished silicon wafers provided are subsequently pretreated individually in an epitaxy reactor. The pretreatment comprises a treatment of the silicon wafer in a hydrogen atmosphere ($H_2$ bake) and a treatment of the silicon wafer with addition of an etching medium to the hydrogen atmosphere, preferably in a temperature range of 950 to 1200° C. The etching medium is preferably hydrogen chloride (HCl).

The pretreatment in a hydrogen atmosphere is effected at a hydrogen flow rate of 1-100 slm (standard liter per minute), more preferably 40-60 slm, and duration of pretreatment in a hydrogen atmosphere is preferably 10-120 s.

During pretreatment with the etching medium, the flow rate of the etching medium is 1.5-5 slm. The hydrogen flow rate is also 1-100 slm, more preferably 40-60 slm, during pretreatment with the etching medium.

It has been shown that the global flatness of an epitaxially coated silicon wafer can be significantly improved by the increased flow rate of the etching medium in comparison with the prior art. By virtue of the fact that the HCl flow rate is increased to 1.5-5 slm and the hydrogen flow rate is 1-100 slm as in the first pretreatment step, the thickness of the silicon wafer is reduced to a greater extent at the edge than in the direction of a center of the silicon wafer. This counteracts the concave initial geometry of the silicon wafer.

Whereas no increased material removal is observed at the edge of the silicon wafer (the material removal is uniform over the entire wafer) at an $H_2$ flow rate of 50 slm (standard liter per minute) and an HCl flow rate of 0.9 slm, that is to say the customary HCl flow rate in the prior art, a material removal of up to 500-700 nm occurs at the edge of the silicon wafer as a result of an increase in the HCl flow rate to 1.5-5 slm, that is to say with a significantly increased HCl concentration, depending on the duration of the treatment with HCl.

A treatment duration of 10-120 s is preferred, most preferably 20-60 s, during the HCl etching treatment—depending on the desired material removal at the edge of the silicon wafer to be epitaxially coated.

The particular advantage of this method is that after the pretreatment steps the silicon wafer obtains an optimum form of the front side for the subsequent deposition of an epitaxial silicon layer since the silicon wafer is leveled in its edge region by the pretreatment, the compensating for the concave form of the silicon wafer. It is even possible to convert the geometry into a convex form, as will be shown later on the basis of examples.

It is particularly advantageous that a laminar gas flow prevails as a result of the increased $H_2$ flow rate in comparison with the closest prior art in the second pretreatment step. It has been shown that this laminar flow has an additional positive effect on the global flatness of the epitaxially coated silicon wafer, which goes beyond the effect observed in the prior art (by the reduction of the $H_2$ flow rate in the second pretreatment step).

The second method according to the invention involves controlling the distribution of the HCl flow in the reactor chamber. As already described in the prior art, for the Epi Centura-Reactors from Applied Materials, a device called Accusett™ is available, comprising valves ("metering valves"), which permits controlling flow distribution. The flow of the etching medium is distributed into an inner and into an outer zone of the reactor chamber. The control is preferably effected by means of suitable software.

The etching medium distributed into the inner zone acts on a region around the center of the silicon wafer situated on a susceptor. That part of the etching medium which is distributed into the outer zone of the chamber acts on an outer region of the silicon wafer, that is to say in particular on the edge region. Overall, inner and outer zones correspond approximately to the size of the silicon wafer to be treated.

In accordance with the second method according to the invention, the flow rate of the etching medium is 1.5-5 slm. The distribution of the etching medium between inner and outer zones is 0 to at most 0.75. This ratio results from the quantity of etching medium in the inner zone relative to the quantity of etching medium in the outer zone. A clear difference is shown here with respect to the prior art, which prescribes a distribution of 1.0 up to 6.0 during the etching treatment as in US 2008/0182397 A1.

The size of the inner and outer zones relative to the silicon wafer can likewise be controlled, most simply by corresponding arrangement and configuration of the gas inlet devices ("injectors"), which conduct the gases into the reactor chamber. By way of example, the inner zone could be a circular region having a diameter of 75 mm in the center of the silicon wafer, given a wafer diameter of 300 mm, as already described in US 2008/0182397 A1.

In the method according to the invention, the inner zone preferably corresponds to a circle having a diameter of 100 mm in the center of the silicon wafer, while the outer zone corresponds to a ring having a width of 100 mm which encompasses the edge of the silicon wafer. Silicon wafers having a diameter of 300 mm are likewise assumed in the case of these values. With the use of silicon wafers of the next generation—which are currently in development—having a substrate diameter of 450 mm, inner and outer zones are chosen analogously thereto, likewise in the case of smaller substrates such as 200 mm or 150 mm wafers.

The quantity of the etching medium is preferably realized by altering the diameter of the gas pipelines for inner and outer zones. The quantity of the etching medium is reduced by reducing the line diameter.

In principle, the following construction is preferred in the second method according to the invention: the gas quantity is set by means of a Mass Flow Controller (MFC) which is able to set a flow rate of between 1 and 5 slm. This is novel since the MFC used in the prior art was limited to 1 slm. This quantity of gas is then passed via a main gas line to two needle valves (inner and outer zones) and distributed there. The regulation is effected by setting the valves (regulation of the line diameter, inner and outer zones independently of one another). The distributed quantities of gas are then introduced into the reactor chamber by means of an injector.

This construction has the advantage that an automatic control is possible by means of suitable software. With regard to the treatment durations and the treatment temperatures, the value ranges preferred in the first method according to the invention are also preferred in the second method.

After the pretreatment steps, an epitaxial layer is deposited at least on the polished front side of the silicon wafer. For this purpose, a silane source as source gas is added to hydrogen as carrier gas. The epitaxial layer is deposited at a temperature of 900-1200° C. depending on the silane source used. Trichlorosilane (TCS) is preferably used as the silane source, at a deposition temperature of 1050-1150° C. The thickness of the deposited epitaxial layer is preferably 0.5-5 μm. After the deposition of the epitaxial layer, the epitaxially coated silicon wafer is removed from the epitaxy reactor.

After a specific number of epitaxial depositions on silicon wafers, the susceptor is treated with an etching medium, preferably with HCl, in order to free the susceptor of silicon deposits, by way of example. A susceptor etching is preferably effected after 1-5 epitaxial coatings of silicon wafers. For this purpose, the epitaxially coated silicon wafer is removed and the substrate-free susceptor is treated with HCl. Preferably, besides the susceptor surface, the entire process chamber is flushed with hydrogen chloride in order to remove silicon deposits. The susceptor is preferably coated with silicon after the susceptor etching and before further epitaxial processes. This may be advantageous since the silicon wafer to be epitaxially coated does not then bear directly on the susceptor.

Moreover, it has been shown that the method according to the invention is suitable for producing a silicon wafer which comprises a front side and a rear side, wherein at least its front side is polished and an epitaxial layer is applied at least on its front side, and which has a global flatness value GBIR of 0.02-0.06 µm, relative to an edge exclusion of 2 mm. If an edge exclusion of 1 mm is employed, that is to say a more stringent criterion, this results in GBIR values of 0.04 to 0.08 µm.

The silicon wafer, which was subjected to a hydrophilic cleaning after the polishing of at least its front side, as a result of which a native oxide layer is formed on the silicon wafer, was subsequently pretreated in a hydrogen atmosphere in an epitaxy reactor in order to remove native oxide from the silicon wafer, and was subsequently treated with addition of hydrogen chloride to the hydrogen atmosphere in a second step, the HCl flow rate being 1.5-5 slm in the second step, which makes it possible to remove silicon material in a targeted manner in the edge region of the silicon wafer to compensate for the concave initial geometry of the polished silicon wafer or to overcompensate for it (convex geometry) and to give the silicon wafer a flatter geometric form after the epitaxial deposition.

It has been shown that a further improvement of the global flatness values of the epitaxially coated silicon wafers is achieved by an increase in the HCl flow rate to 2 slm or more (up to 5 slm).

This also applies to the local flatness, expressed by the $SBIR_{max}$, which, in the case of the silicon wafer according to the invention, is greater than or equal to 0.02 µm and less than or equal to 0.05 µm, likewise given an edge exclusion of 2 mm and relative to partial regions of an area grid of segments having a size of 26×8 mm². This results in 336 segments, of which 52 are "partial sites". The "partial sites" are preferably taken into account in the determination of the $SBIR_{max}$. The PUA value is preferably 100%. Relative to an edge exclusion of 1 mm, an $SBIR_{max}$ of 0.04 to 0.07 µm results.

The silicon wafer is preferably a wafer made of monocrystalline silicon material, an SOI ("silicon-on-insulator") wafer, a silicon wafer with a strained silicon layer ("strained silicon") or an sSOI ("strained silicon-on-insulator") wafer which is provided with an epitaxial layer.

The epitaxially coated silicon wafer according to the invention preferably has an epitaxial layer thickness regularity of at most 2.0%. The epitaxial layer thickness regularity can be determined by measuring average value t and range $\Delta t = t_{max} - t_{min}$ of the epitaxial layer thickness. $\Delta t/t$ is more preferably 0.5%-2.0%, and most preferably 1.0%-1.5%. The method according to the invention, for the gas flows and gas flow distributions claimed, permits the production of epitaxially coated silicon wafers having these epitaxial layer thickness regularities.

If, in the prior art, it is attempted to correct the concave initial geometry of the polished silicon wafer by a procedure in which a thicker epitaxial layer is deposited in the center of the silicon wafer during epitaxy, or by a procedure in which firstly a substantially uniform epitaxial layer is deposited, and the concave geometry of the epitaxially coated silicon wafer is subsequently corrected by etching removal at the epitaxial layer, it is impossible to maintain the epitaxial layer thickness uniformity parameter, which is extremely important and critical for the component manufacturers, in that narrow range of less than or equal to 2%.

EXAMPLE

An epitaxial layer was deposited on a silicon wafer having a diameter of 300 mm that had been produced in accordance with the prior art and finally polished by means of CMP on its front side. The silicon wafer to be epitaxially coated was concavely polished, that is to say had a concave initial geometry and an edge roll-off.

During the pretreatment of this silicon wafer in the epitaxy reactor, firstly a pretreatment in a hydrogen atmosphere was effected at an $H_2$ flow rate of 50 slm.

During the subsequent pretreatment, with hydrogen chloride added into the hydrogen atmosphere, the HCl flow rate was 2.5 slm. Different gas distributions were examined in accordance with the second method according to the invention. The duration of the pretreatment with hydrogen chloride was 60 s in each case.

An epitaxial layer was subsequently deposited at a deposition temperature of 1120° C. and a trichlorosilane flow rate of 17 slm.

The results are explained below with reference to FIGS. 1 to 8.

Figure 1:
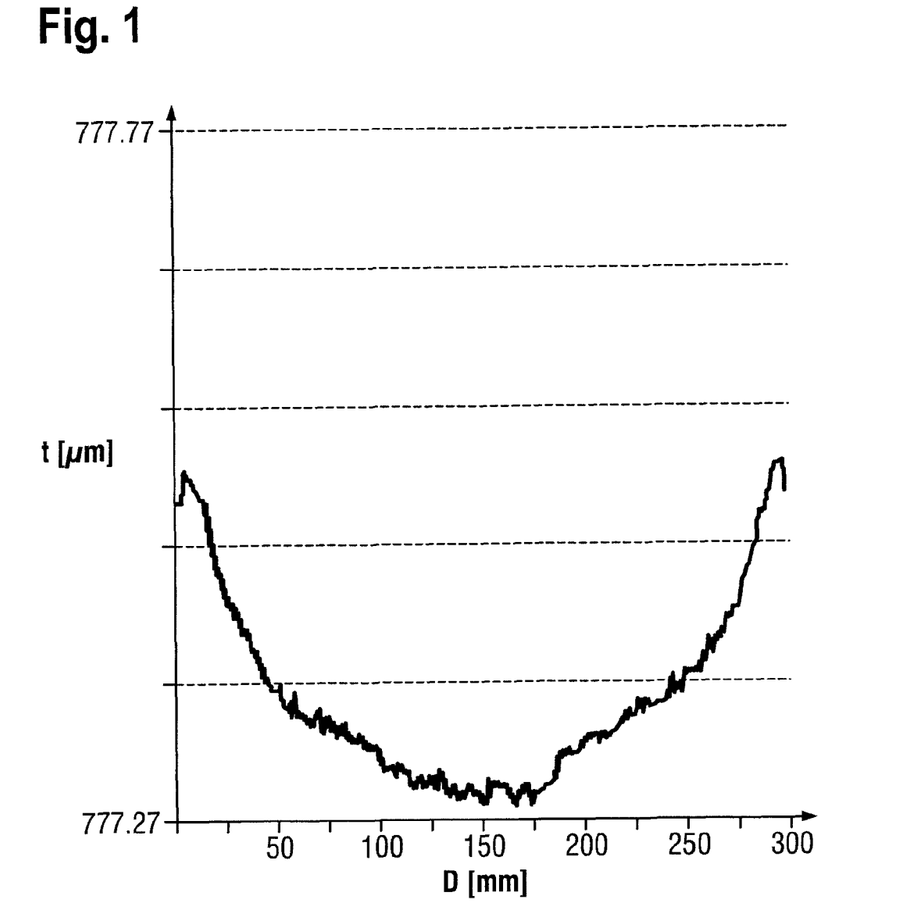
FIG. 1 shows the profile of the thickness of a concavely polished silicon wafer against its diameter ("line scan").

FIG. 1 illustrates the thickness distribution of a concavely polished silicon wafer having a diameter of 300 mm as a function of the diameter as a line scan. An edge exclusion of 2 mm is taken as a basis here. The thickness increases from the center in the direction of the edge and exhibits a decrease at the edge. A global flatness value GBIR of 0.3 µm results given an edge exclusion of 2 mm.

Figure 2:
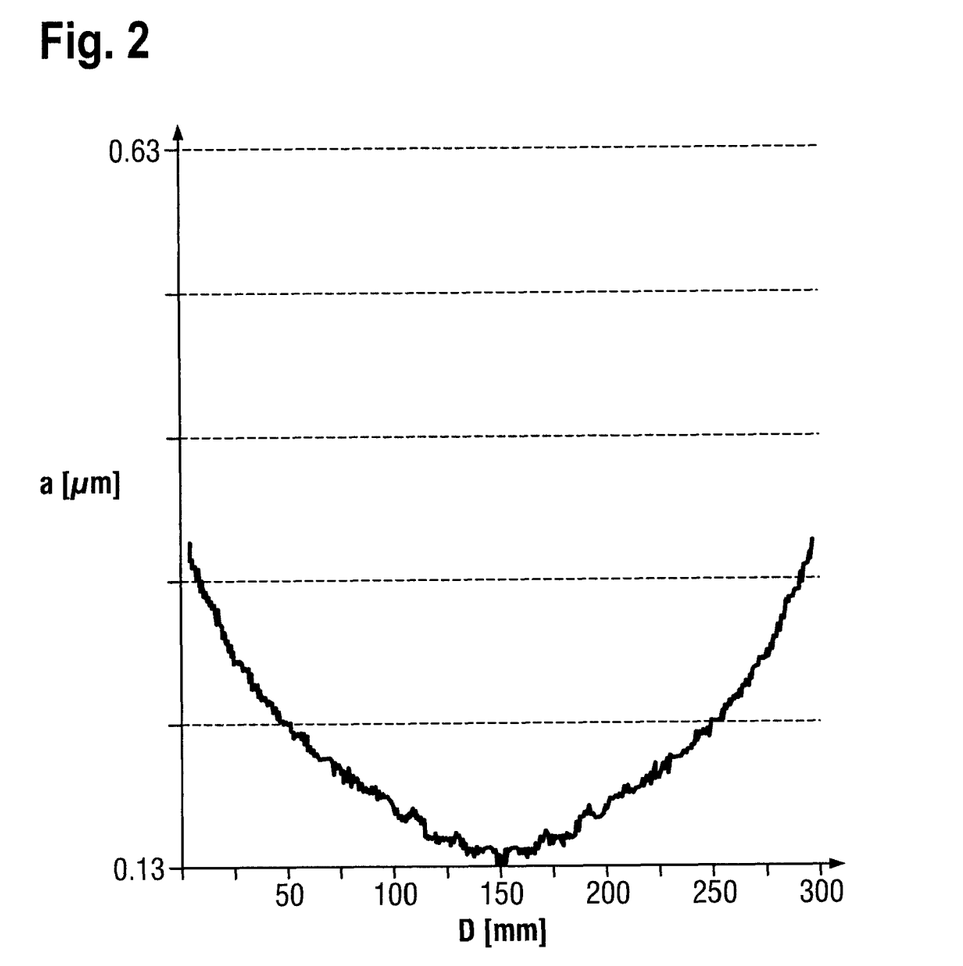
FIG. 2 shows the material removal during an etching pretreatment of a polished silicon wafer in the epitaxy reactor against its diameter.

FIG. 2 shows the material removal during the etching pretreatment as a function of the diameter of the silicon wafer. While approximately 0.13 µm of silicon is removed in the center of the silicon wafer, the material removal increases toward the edge and exhibits overall a concave profile, precisely like the initial geometry of the polished silicon wafer, with the result that a compensation of the concave initial geometry is achieved by etching away the silicon material.

Figure 3:
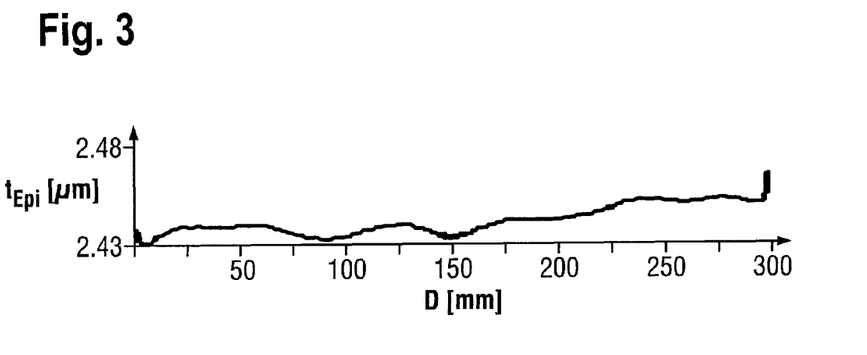
FIG. 3 shows essentially the thickness of the deposited epitaxial layer against a line scan.

FIG. 3 illustrates the difference in thickness between the epitaxially coated silicon wafer and the concavely polished silicon wafer as a function of the diameter as a line scan. This difference in thickness increases locally in the edge region. However, it does not correspond to the actual thickness of the deposited epitaxial layer, but rather also takes account of the changes in thickness as a result of pretreatment steps. Since material was removed at the edge of the silicon wafer during the pretreatment with the etching medium, significantly more silicon than illustrated in FIG. 3 was accordingly deposited at the edge. The material removal at the edge was up to 700 nm, which was then overgrown by a uniform epitaxial layer having a thickness of 2.6 µm±1.5%. This complies with a specification for the layer thickness uniformity of the epitaxial layer.

Figure 4:
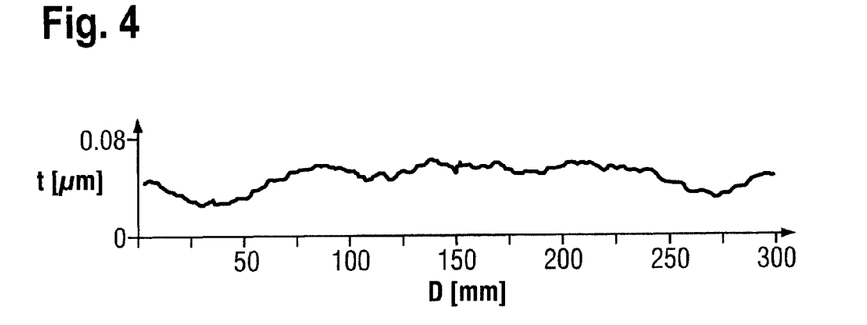
FIG. 4 shows the thickness of the epitaxially coated silicon wafer against a line scan.

FIG. 4 illustrates the thickness profile of the epitaxially coated, CMP-polished silicon wafer as a function of its diameter as a line scan, resulting in a global flatness value GBIR of 0.056 µm given an edge exclusion of 2 mm, in other words a significant improvement in comparison with the global flatness of the concavely polished silicon wafer. A significant improvement with respect to the closest prior art is also manifested.

Figure 5:
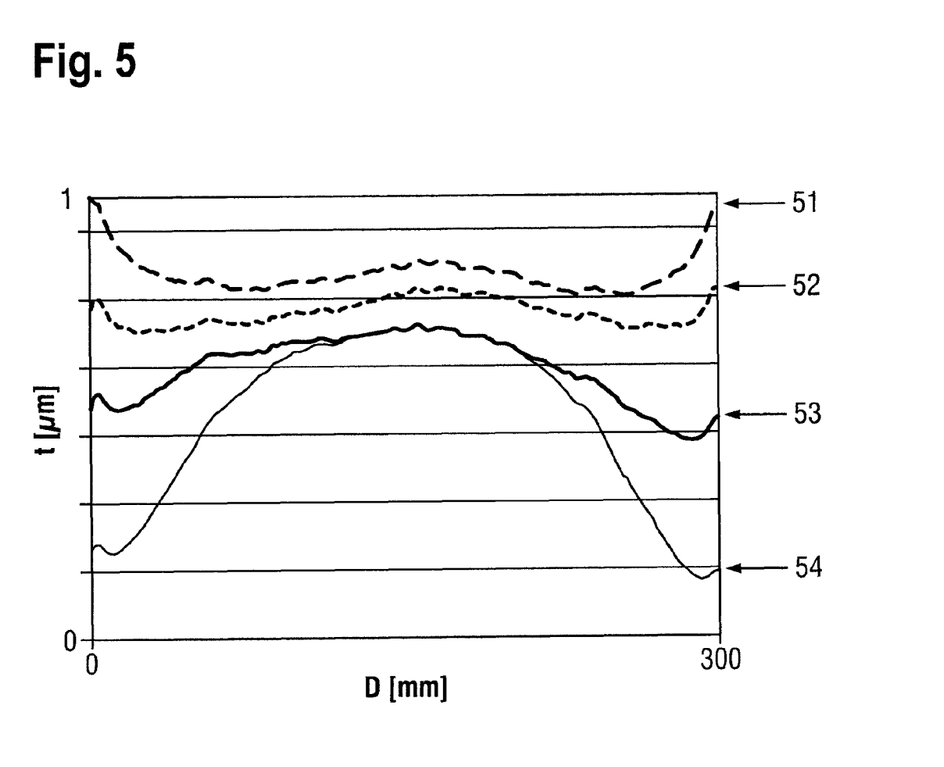
FIG. 5 shows the influence of different process parameters during the etching pretreatment on the wafer geometry, in particular with regard to the material removal in the edge region.

FIG. 5 shows the initial geometry of a polished silicon wafer 51. The illustration shows the thickness of the silicon wafer as a function of the diameter thereof. A concave profile and a decrease in the thickness at the edge are manifested.

52 shows the thickness of the silicon wafer after pretreatment with an HCl flow rate of 0.9 slm (prior art). This corresponds to a standard etch with the HCl flow rate limited by the conventional mass flow controller.

53 shows the geometry of the wafer after treatment according to the invention with an HCl flow rate of 2.5 slm (first method according to the invention).

54 shows the geometry of the wafer after treatment according to the invention with an HCl flow rate of 2.5 slm and gas distribution according to the invention I/O=0/200=0 (second method according to the invention).

In the case of 53 and particularly in the case of 54, an increase in the etching removal is particularly manifested in the edge region. The methods according to the invention enable even more distinct changes in the initial geometry of the polished wafer which convert the concave geometry into a convex geometry and can give the wafer, prior to the subsequent epitaxial deposition, a geometry which conforms to the respective requirements and is optimum—depending on the initial geometry.

Figure 6:
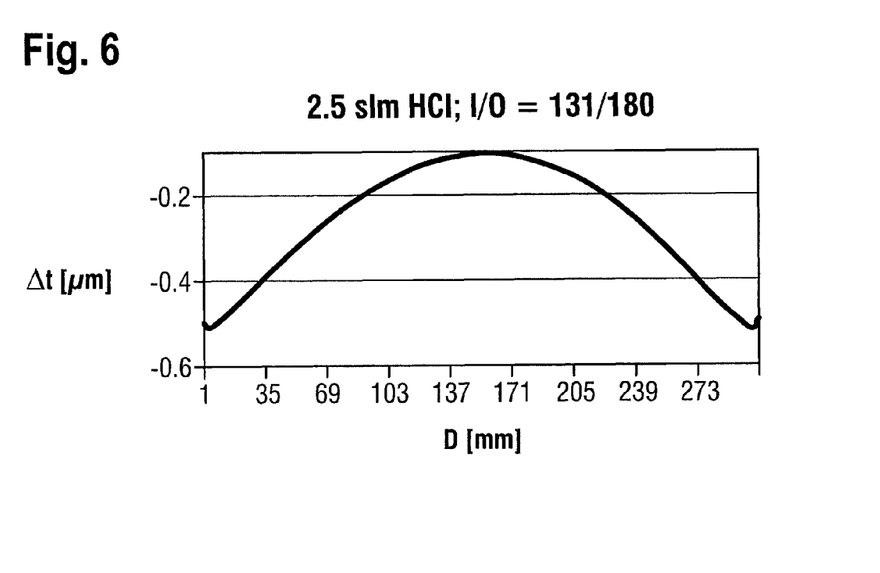
FIG. 6 shows the change in the thickness of the silicon wafer during an etching pretreatment in the epitaxy reactor.

FIG. 6 shows the change in the geometry of the polished silicon wafer as a result of an etching pretreatment according to the invention. Here an HCl flow rate of 2.5 slm was chosen, and as flow distribution I/O=131/180=0.73. A material removal at the edge of up to 500 nm is manifested here. The illustration shows the difference in thickness Δt (=material removal) between polished wafer and wafer pretreated in the epitaxy reactor, as a function of the diameter.

Figure 7:
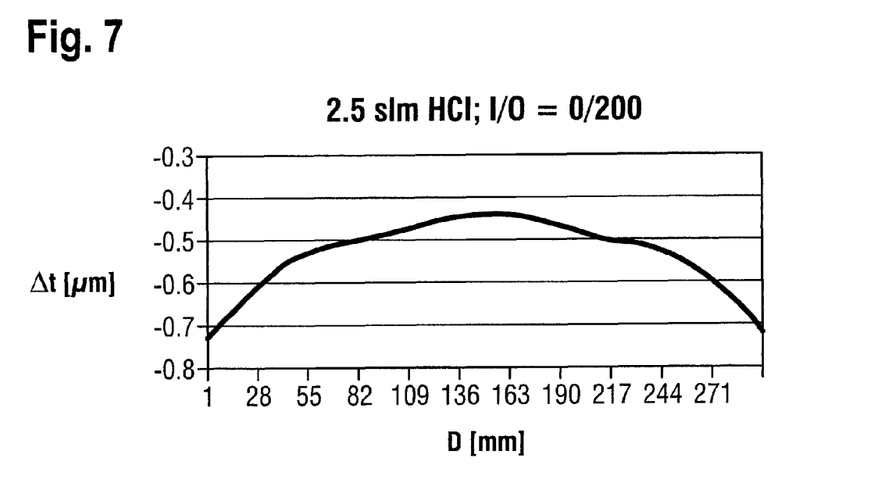
FIG. 7 shows the change in the thickness of the silicon wafer during an etching pretreatment in the epitaxy reactor with a changed gas distribution.

FIG. 7 shows the change in the geometry of the wafer, in which case, in comparison with the example of FIG. 6, a different flow distribution of I/O=0/200=0 was chosen, with a constant HCl flow rate of 2.5 slm. Here, too, the illustration shows the difference in thickness Δt or the material removal as a result of the etching pretreatment as a function of the diameter of the wafer. By virtue of the changed gas distribution, the material removal at the edge is intensified to up to 700 nm.

In the prior art, even with reduction of the $H_2$ flow rate during the etching pretreatment, which, as already mentioned, entails other disadvantages, only material removals of up to 300 nm at the edge were possible (cf. DE 102005045339 A1).

Figure 8:
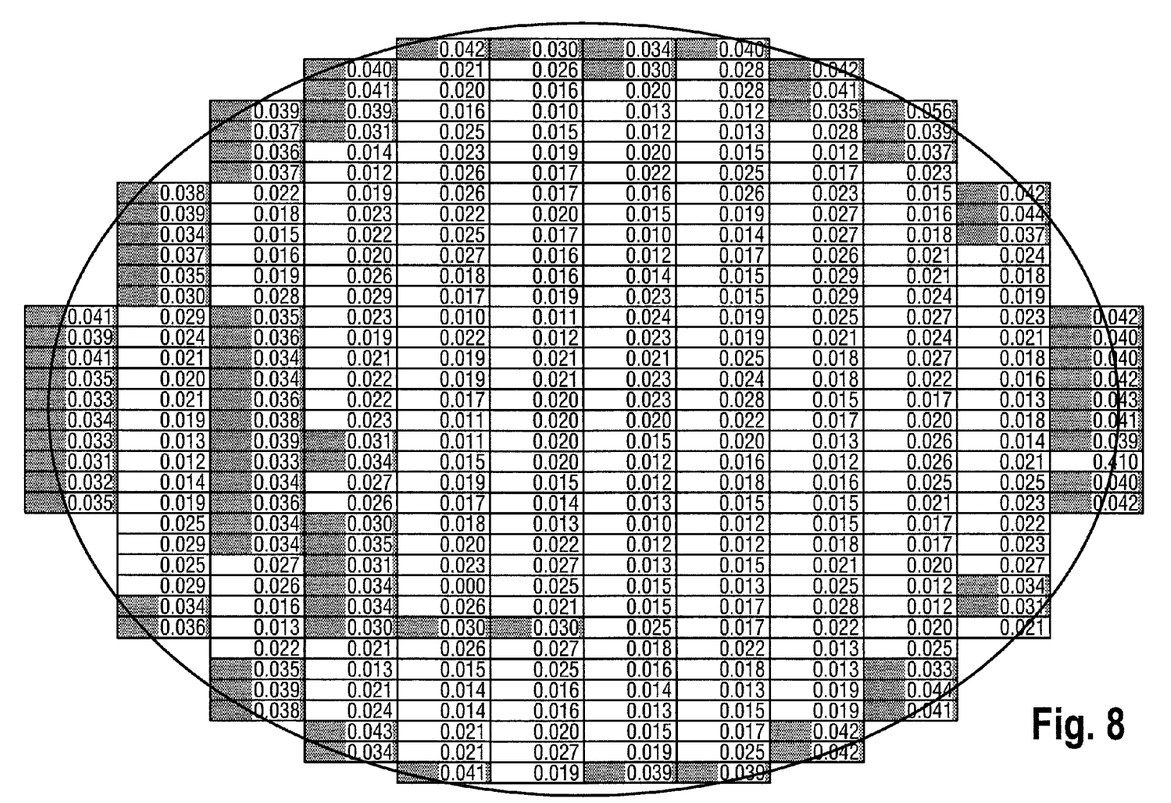
FIG. 8 shows SBIR values of a silicon wafer epitaxially coated according to the invention for each component area.

FIG. 8 illustrates site geometry values SBIR for an epitaxially coated silicon wafer given a subdivision into 336 component areas ("sites") having a size of 26×8 mm². 52 of these 336 component areas are "partial sites". Using an edge exclusion of 2 mm or an FQA of 296 mm and taking account of all the "partial sites", a maximum site geometry value $SBIR_{max}$ of 0.044 μm results in this case. The following process parameters were employed in this example:

|  | Step 1<br>$H_2$ bake | Step 2<br>Etching | Step 3<br>Deposition |
| --- | --- | --- | --- |
| Distribution I/O | 110/157 | 0/200 | 110/157 |
| HCl in slm | — | 3.5 | — |
| $H_2$ in slm | 60 | 20 | 50 |
| Temperature | 1150 | 1150 | 1120 |

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing epitaxially coated silicon wafers, comprising providing a multiplicity of silicon wafers polished at least on their front sides and successively individually coating the wafers in an epitaxy reactor by a procedure in which a silicon wafer is placed on a susceptor in the epitaxy reactor, and is pretreated only under a hydrogen atmosphere in a first step, and with addition of an etching medium with a flow rate of 1.5-5 slm to the hydrogen atmosphere in a second step, the hydrogen flow rate being 1-100 slm in both steps and the distribution of the etching medium in inner and outer zones being I/O =0-0.75, subsequently coating the wafer epitaxially on its polished front side, and removing an epitaxillay coated wafer from the epitaxy reactor.

2. The method of claim 1, wherein the two pretreatment steps are effected in a temperature range of 950 to 1200° C.

3. The method of claim 1, wherein the etching medium added to the hydrogen atmosphere is hydrogen chloride.

4. The method of claim 1, wherein the hydrogen flow rate is 40-60 slm in both pretreatment steps.

5. The method of claim 1, wherein the duration of pretreatment is 10-120 s in both pretreatment steps.

6. The method as claimed in any of claims 1 to 5, wherein the duration of pretreatment is 20-60 s in both pretreatment steps.

7. The method of claim 1, wherein the silicon wafers provided are wafers of monocrystalline silicon material, SOI ("silicon-on-insulator") wafers, silicon wafers having strained silicon layers ("strained silicon") or sSOI ("strained silicon-on-insulator") wafers.

8. A method for producing epitaxially coated silicon wafers, comprising providing a multiplicity of silicon wafers polished at least on their front sides, and successively individually coating the wafers in an epitaxy reactor by a procedure in which a silicon wafer is placed on a susceptor in a reactor chamber of the epitaxy reactor, wherein gas flows introduced into the reactor chamber by means of injectors are distributed by means of valves into an outer zone and an inner zone of the reactor chamber such that the gas flow in the inner zone acts on a region around the center of the silicon wafer and the gas flow in the outer zone acts on an edge region of the silicon wafer, wherein the silicon wafer is pretreated only under a hydrogen atmosphere at a hydrogen flow rate of 1-100 slm in a first step, and with addition of an etching medium with a flow rate of 1.5-5 slm to the hydrogen atmosphere in a second step, the hydrogen flow rate being 1-100 slm in the second step, and the distribution of the etching medium in inner and outer zones being I/O=0-0.75, and subsequently epitaxially coating the wafer on its polished front side, and removing an epitaxially coated wafer from the epitaxy reactor.

9. The method of claim 8, wherein the two pretreatment steps are effected in a temperature range of 950 to 1200° C.

10. The method of claim 8, wherein the etching medium added to the hydrogen atmosphere is hydrogen chloride.

11. The method of claim 8, wherein the hydrogen flow rate is 40-60 slm in both pretreatment steps.

12. The method of claim 8, wherein the duration of pretreatment is 10-120 s in both pretreatment steps.

13. The method of claim 8, wherein the duration of pretreatment is 20-60 s in both pretreatment steps.

14. A silicon wafer having a front side and a rear side, wherein at least its front side is polished and an epitaxial layer is applied at least on its front side, which has a global flatness value GBIR of 0.02-0.06 μm, relative to an edge exclusion of 2 mm, or a global flatness value GBIR of 0.04-0.08 μm relative to an edge exclusion of 1 mm.

15. The silicon wafer of claim 14, having a local flatness, $SBIR_{max}$, of greater than or equal to 0.02 μm and less than or equal to 0.05 μm, given an edge exclusion of 2 mm and relative to partial regions of an area grid of segments having a size of 26×8 mm².

16. The silicon wafer of claim 14, having a local flatness, $SBIR_{max}$, of greater than or equal to 0.04 μm and less than or equal to 0.07 μm, given an edge exclusion of 1 mm and relative to partial regions of an area grid of segments having a size of 26×8 mm².

17. The silicon wafer of claim 14, wherein the silicon wafer is a wafer made of monocrystalline silicon material, an SOI wafer, a silicon wafer with a strained silicon layer or an sSOI wafer which is provided with an epitaxial layer.

18. The silicon wafer of claim 14, having an epitaxial layer thickness uniformity of 0.5%-2%.

19. The silicon wafer of claim 14, having an epitaxial layer thickness uniformity of 1.0%-1.5%.

\* \* \* \* \*